TRANSISTOR DIFFERENTIAL OPERATIONAL AMPLIFIER

Filed Oct. 3, 1966 2 Sheets-Sheet 1

INVENTOR:
TAGE P. SYLVAN,
BY Robert J. Mooney
HIS ATTORNEY.

INVENTOR:
TAGE P. SYLVAN,
BY Robert J. Mooney
HIS ATTORNEY.

United States Patent Office 3,482,177
Patented Dec. 2, 1969

3,482,177
TRANSISTOR DIFFERENTIAL OPERATIONAL AMPLIFIER

Tage P. Sylvan, Liverpool, N.Y., assignor to General Electric Company, a corporation of New York Filed Oct. 3, 1966, Ser. No. 583,557
Int. Cl. H03f 3/68
U.S. Cl. 330—30 10 Claims

ABSTRACT OF THE DISCLOSURE

An improved transistorized differential-operational amplifier having a pair of input transistors to which respective input signals are applied and a pair of output transistors driven by the input transistors to provide a differential output which is proportional to the difference of the input signals. The improvements include a Zener diode and a current regulator transistor coupled to the emitter electrodes of the input transistors and a control circuit coupled to the commonly connected base electrodes of the output transistors. Together, these improvements provide an amplifier circuit capable of compensating for the equivalent input current drift of the amplifier against changes in transistor current gain with temperature, changes in bias and load resistors with temperature and changes in supply voltages.

This invention relates to amplifier circuits and more particularly to differential operational amplifier circuits of the type employing transistorized circuitry.

An ideal differential amplifier should have the following characteristics:

(1) Zero change in differential error voltage and zero changes in input current with changes in ambient temperature (i.e., a zero temperature coefficient).

(2) Zero change in differential error voltage and zero change in input current with changes in time (i.e., zero voltage and current drift).

(3) Zero change in differential error voltage and zero change in input current with changes in supply voltage (i.e., infinite voltage power supply rejection and infinite current power supply rejection).

(4) Zero change in differential error voltage and zero change in input current with changes in the common mode voltage (i.e. that portion of the voltage applied in common to both signal inputs) (i,e., infinite voltage common mode rejection and infinite current common mode rejection).

(5) High input impedance to common mode voltages (i.e. when inputs are tied together). This feature is necessary to give a high input impedance for a differential operational amplifier connected in a non-inverting feedback configuration or connected as a unity gain follower (buffer) amplifier.

(6) High gain at high signal frequencies.

Presently available transitorized differential amplifiers do not approach these idealized requirements to an adequate extent to satisfy market demands. They suffer from several shortcomings. These shortcomings are attributed for the most part to the sensitivity of the transistorized differential amplifier circuit to variations in the amplifier supply voltage, common mode voltage dependence, temperature dependence and drift. Furthermore, the transistor differential amplifier has been limited in its applications because of its relatively low operating input impedance and relatively narrow available operating frequency range.

Many attempts have been made to overcome these various objectionable operating limitations, but these have generally required complex, expensive and difficult to maintain circuits.

Accordingly, it is the object of the present invention to provide a differential operational amplifier, of the type employing semiconductor translating devices, having improved performance.

It is a further object of this invention to provide such an amplifier which is substantially independent of changes in the common mode voltage and supply voltages supplied to such an amplifier.

It is another object of the present invention to provide an arrangement for improving the performance of transistorized differential operational amplifiers by using more efficient circuitry.

It is a further object of the present invention for improving the performance of transistorized differential operational amplifiers by employing circuitry serving multiple functions.

It is another object of the present invention provide a transistorized differential operational amplifier which is relatively insensitive to changes in the supply voltage, common mode voltage, temperature and drift while permitting relatively high input impedance operation over a wide range of operating frequencies.

The features of the invention which are believed to be novel are set forth with particularity in the appended claims. The invention itself, however, both as to its organization and method of operation together with further objects and advantages thereof may best be understood by reference to the following description when taken in connection with the following drawings, wherein:

Figure 1:
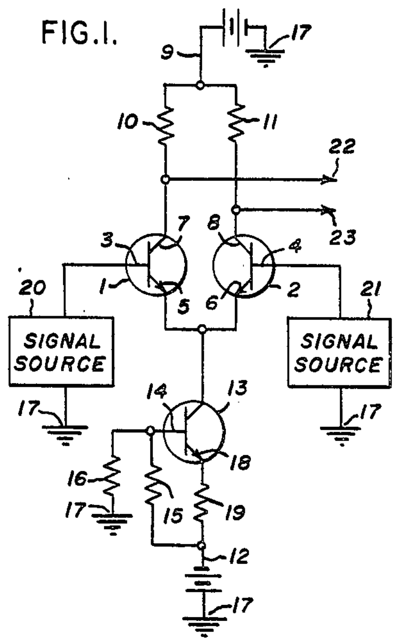
FIGURE 1 illustrates a prior art differential amplifier arrangement having limited performance characteristics.

Referring to FIGURE 1, there is shown a prior art arrangement including a first and a second input transistor 1 and 2. Each of these input transistors comprises a base electrode 3 and 4 respectively, emitter electrodes 5 and 6 respectively, and collector electrodes 7 and 8 respectively. Transistors 1 and 2 have their collector-emitter interelectrode paths coupled to the positive potential terminal 9 of a unidirectional potentional source by respective load resistors 10 and 11 and to the negative potential terminal 12 of a negative potential source by the collector-emitter interelectrode path of a transistor 13. Device 13 functions as a constant current source by having its base electrode 14 connected through resistor 15 to the negative potential terminal 12 and through resistor 16 to the output terminal 17 of a reference potential source (which as shown may be ground), and its emitter electrode 18 connected through a resistor 19 to the negative potential terminal 12. The functioning of the constant current source is well known in the art and suffice it to say that it provides a constant current to each of the input transistors 1 and 2 which is independent of the common mode voltage.

A first source of input signals 20 is connected between the base electrode 3 of transistor 1 and the reference potential terminal 17. A second source of input signals 21 is connected between the base electrode 4 of transistor 2 and the common reference potential terminal 17. Output terminals 22 and 23 connected to the collector electrodes of transistors 1 and 2 provide a measure of the difference in amplitude of the signals applied to the base electrodes 3 and 4 of transistors 1 and 2. As the relative amplitudes of the input signals change, it is desired that a signal proportional to the amplitude of their difference appears between the output terminals 21 and 22.

Actually, the overall performance of the differential amplifier arrangement of FIGURE 1 is determined primarily by the characteristics of the input stage, the effects of following stages being less important to an amount at least as great as the voltage gain of the input stage. The input error voltage is determined by the match in the base-emitter voltages of transistors 1 and 2 and by the match of the temperature coefficients of the base-emitter voltage. The input currents are determined by the base currents required by transistors 1 and 2 which is determined by the operating collector currents of these transistors and their DC current gains. The variation in the input currents with temperature is determined by the change in current gain of the input transistors with temperature and the variation in input current with common mode voltage or positive supply voltage is determined by the change in current gain with collector-emitter voltage. The variation in differential error voltage with common mode voltage or positive supply voltage is determined by the match in the common emitter reverse voltage transfer ratios for the input transistors 1 and 2. The common mode input impedance of the amplifier is determined primarily by the parallel combination of the common base output resistance and capacitance of transistors 1 and 2 and the voltage gain.

The prior art circuit of FIGURE 1 therefore suffers from several difficulties. For example, if the amplitude of the negative potential developed at terminal 12 changes with respect to the reference potential terminal 17, the current from source 13 no longer is constant but changes, thereby effecting the output signals developed between terminals 21 and 22 independent of changes in the input signals applied to transistors 1 and 2. If the amplitude of potential at terminal 9 changes with respect to the reference potential terminal 17, it causes the potential developed between the collector and emitter electrodes of each of the transistors 1 and 2 to change and thereby to effect the output signal developed between terminals 21 and 22 independent of changes in the input signals applied to the base electrodes 3 and 4. Changes in the amplitude of the potential developed at terminal 9 with respect to the reference potential terminal 17 causes the potential developed between the collector and base of each of transistors 1 and 2 to also change. Changes in the common mode voltage or changes in the positive potential developed at 9 with respect to the reference potential terminal 17 causes a change in the signals developed between terminals 22 and 23 independent of the input signals applied to the base electrodes 3 and 4 of transistors 1 and 2. Also, each of transistors 1 and 2 exhibit a temperature dependence. Depending on operating load conditions, the temperature coefficient of each of these transistors results in a change in output signal developed between terminals 22 and 23 independent of the input signals applied to the base electrodes 3 and 4. The arrangement of FIGURE 1 also exhibits a relatively low input impedance during operation, thereby limiting its application to relatively low impedance sources. This arises in the normal operating situation because of the relatively low input resistance developed between the collector and base of each of the input transistors 1 and 2. Also, the capacitance between the collector and base of each of the input transistors is such that it limits the range of frequencies over which the differential amplifier will function adequately. Obviously, therefore, the circuit arrangement of FIGURE 1 is not as versatile as one would desire. It would be important in the differential operational amplifier art if a circuit were developed which surmounted these difficulties and provided improved performance over a wider range of applications. The arrangement of FIGURE 2 achieves these results.

Figure 2:
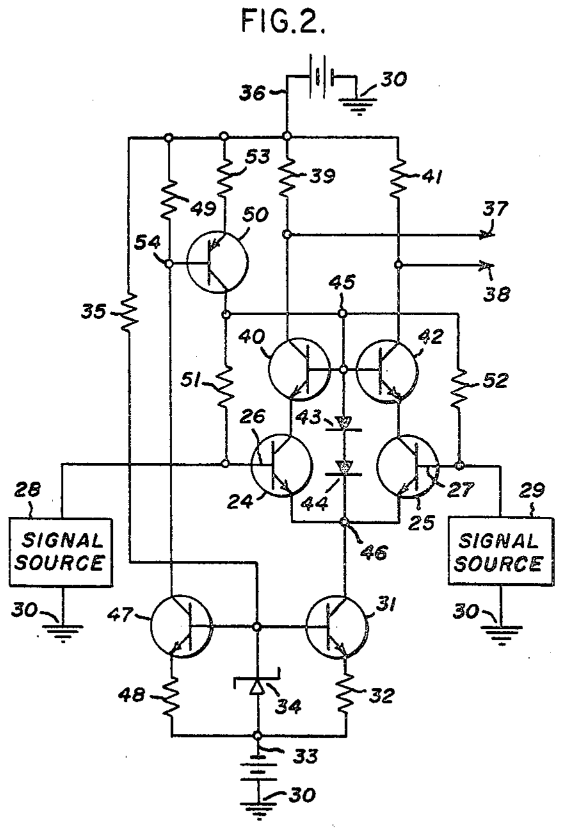
FIGURE 2 illustrates an embodiment of the present invention.

Briefly, in FIGURE 2 there is shown input transistors 24 and 25 having their base electrodes 26 and 27 connected to sources of input signals 28 and 29. The circuits from sources 28 and 29 are completed to a point of ground reference potential 30. Constant current source 31 has its collector electrode connected to the emitter electrode of devices 24 and 25 and its emitter electrode connected through a coupling resistor 32 to the negative potential terminal 33 of a source of unidirectional potential. The base bias for transistor 31 is provided by connecting its base electrode to the junction of a voltage regulator diode 34, such as a Zener diode, and the biasing resistor 35. The other terminal of 35 is connected to terminal 36 of a source of positive potential. The other terminal of the voltage regulator diode 34 is connected to terminal 33.

An output signal proportional to the difference in amplitude of the signal available at the base electrodes of input transistors 24 and 25 from sources 28 and 29 is developed between terminals 37 and 38. Output terminal 37 is connected to the junction of one terminal of load resistor 39 and the collector electrode of an output transistor 40. Output terminal 38 is connected to the junction of one terminal of load resistor 41 and the collector electrode of an output transistor 42. The other terminals of load resistors 39 and 41 are connected to the positive potential terminal 36. The signals developed at the collector electrodes of input transistors 24 and 25 are coupled to respective emitter electrodes of output transistors 40 and 42. The base electrodes of output transistors 40 and 42 are coupled to a control circuit which will be described shortly. This control circuit provides base bias for output transistors 40 and 42 as well as for input transistors 24 and 25.

In the embodiment of FIGURE 2, there is coupled between the commonly connected base electrodes of output transistors 40 and 42 and the commonly connected emitter electrodes of input transistors 24 and 25 a pair of unidirectional conducting devices 43 and 44, such as diodes, which are adapted to provide a constant resistance between points 45 and 46, despite changes in the voltages applied to terminals 36 and 33 and despite common mode voltages from sources 28 and 29. This is achieved as follows. It should be noted that the voltage regulator diode 34 maintains a reference voltage across its terminals despite variations in the potentials applied at terminals 36 and 33. This constant reference voltage is also applied to a current regulator comprising transistor 47. Transistor 47 has its base electrode coupled to the cathode terminal of Zener diode 34 and its emitter electrode connected through a coupling resistor 48 to the negative potential terminal 33. The collector electrode of device 47 is coupled through a coupling resistor 49 to a terminal 36 of the positive potential source.

Current regulator transistor 47 operates to maintain a constant collector current flow such that a fixed potential is maintained across resistor 49 despite variations in the potentials developed at terminals 33 and 36. So far, all transistors mentioned have been of the NPN type. A further current regulating transistor 50 of the opposite conductivity, or PNP type, is provided having its base electrode connected to the junction of resistor 49 with the collector electrode of current regulating device 47. The collector electrode of device 50 is connected to terminal 45 and through separate coupling resistors 51 and 52 to the base electrodes of input transistors 24 and 25. The emitter electrode of device 50 is coupled by means of resistor 53 to terminal 36 of the positive potential source.

The manner in which the potential between terminals 45 and 46 is maintained constant will now be described. The potential across 34 remains constant despite variations in the potential applied to terminals 33 and 36. This causes device 47 to conduct constant current which results in the potential at junction 54 remaining constant with respect to the upper terminal of resistor 49. The potential across 49 being constant causes current regulator transistor 50 to conduct a constant current through a circuit comprising a component of fixed resistance between terminals 45 and 46. In the particular embodiment of FIGURE 2, this circuit comprises a pair of diodes 43 and 44. The diodes 43 and 44 are selected to offer a fixed resistance with constant current flow and to exhibit a predetermined temperature coefficient of resistance which will be described shortly. The result of these features is that the base voltages of output transistors 40 and 42 are maintained fixed with respect to the emitter electrodes of input transistors 24 and 25. In addition, potentials of the emitter electrodes of output transistors 40 and 42 and the collector electrodes of input transistors 24 and 25 are maintained fixed with respect to the emitter electrodes of input transistors 24 and 25. The potential at point 45 is also supplied through coupling resistors 51 and 52 to the base electrodes of input transistors 24 and 25, thereby establishing their base current bias levels.

The arrangement just disclosed results in the current gain in input transistors 24 and 25 being maintained constant because the potential differences between their emitter and collector electrodes are maintained constant, the current flow through these devices being maintained constant because of the operation of the constant current transistor 31, the bias current supplied to the base electrode of devices 24 and 25 being maintained constant because of their connection through resistors 51 and 52 to point 45. All this results in the output signal developed between terminals 37 and 38 being proportional to the difference in amplitude between the signals available from sources 28 and 29 at the base electrodes of input transistors 24 and 25, independent of variations in the supply voltage supplied to terminals 33 and 36 and independent of the common mode voltages applied to the base electrodes of input transistors 24 and 25.

In a practical embodiment, each of the input transistors 24 and 25 are matched to exhibit the same coefficient of temperature (that is, base current decrease with increase in temperature). In a preferred embodiment, the current bias through diodes 43 and 44 is chosen such that the temperature coefficient of voltage of these diodes is matched to the temperature coefficient of base current of transistors 24 and 25. Thus, diodes 43 and 44 serve a dual function, that of compensating for the temperature coeffiicent of devices 24 and 25 as well as in conjunction with transistors 40 and 42 regulating the collector emitter voltage of transistors 24 and 25 and thus enabling the transistorized differential amplifier to produce output signals independent of supply voltage changes and common mode voltages supplied to the differential amplifier.

Figure 3:
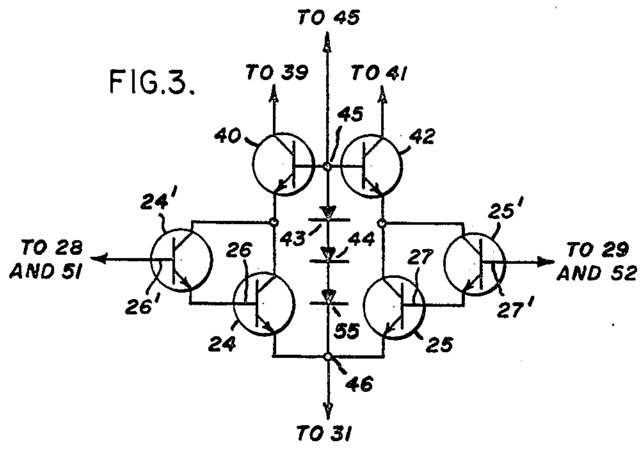
FIGURE 3 illustrates a further application of the invention to an embodiment providing higher input current gain.

The circuit arrangement of FIGURE 2 can be modified to accommodate higher current gains. For example, referring to FIGURE 3, the single pair of input transistors is replaced with two pairs of input transistors 24 and 24' and 25 and 25' respectively. Since the circuit arrangement of FIGURE 3 makes use of elements common to FIGURE 2, common numbering is resorted to. Essentially, transistors 24 and 24' are NPN transistors having their collector electrodes connected together with the emitter electrode of the leading transistor 24' coupled to the base electrode of the following transistor 24. The result of this combination is that 24 and 24' provide a higher current gain than the single transistor 24 shown in FIGURE 2, thereby providing higher output signal differences in desired cases. In FIGURE 3, an additional diode 55 in shown to indicate that a larger voltage needs to be developed across terminals 45 and 46 because of the use of the two transistors 24 and 24'.

Figure 4:
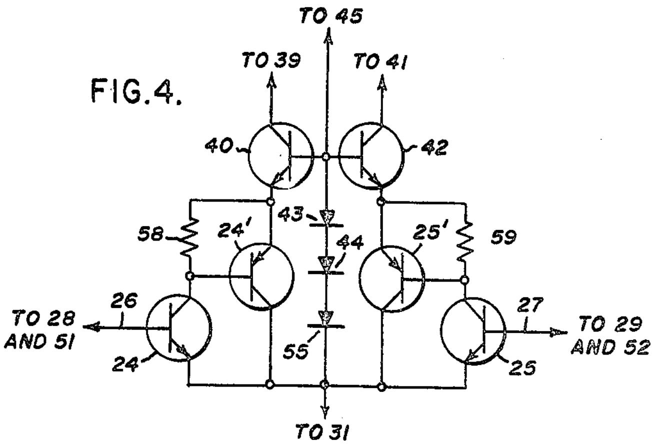
FIGURE 4 illustrates a further embodiment of the invention permitting operation with still higher input current gain.

In some instances it may be desirable to provide a different form of higher gain circuit. For example, in FIGURE 4, the transistors 24' and 25' are shown to be of the PNP type. This might be desirable where one is interested in acquiring higher current gain while operating with a lower resistance between terminals 26 and 27. In the arrangement of FIGURE 4, this resistance is established by the single base to emitter circuit of the transistor 24. The second or PNP input transistor 24' is shown having its base electrode directly connected to the collector electrode of transistor 24 and through resistor 58 to the emitter electrode of device 40. The PNP transistor 25' is similarly connected to transistors 25 and 42.

Depending on applications, it is sometimes simpler, less costly (or more effective) to obtain and use compensating transistors with matching temperature coefficients than it is to find compensating diodes such as 43 and 44 of FIGURE 2 and attempt to balance the diodes such that their temperature coefficients match that of the input transistors 24 and 25. Where resort is made to compensating transistors, additional control of the compensating transistors is required. This will become more obvious from a consideration of the embodiment of the invention shown in FIGURE 5.

Another way of obtaining the minimized input currents that are achieved by the multiple stage input transistor arrangements of FIGURES 3 and 4 is to use field effect transistors in place of the bipolar input transistors 24 and 25 of FIGURE 2.

Figure 5:
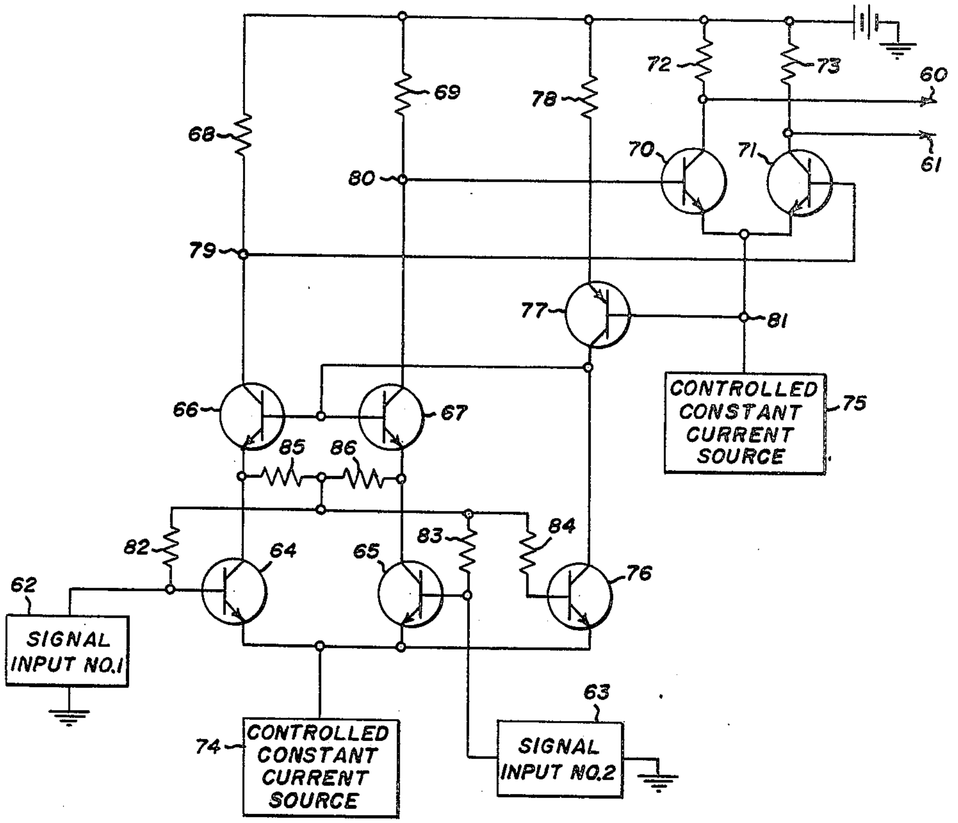
FIGURE 5 illustrates a still further embodiment of the invention utilizing more readily obtainable components.

Since the circuit of FIGURE 5 is similar in many respects to that of FIGURE 2, it is sufficient to say that the differential amplifier shown produces output signal between output terminals 60 and 61 which is proportional to the difference in amplitude of the signals available from input signal sources 62 and 63. Transistors 64 and 65 constitute the first stage of input transistors, and transistors 66 and 67 the related output transistors. The output from transistors 66 and 67 developed across load resistors 68 and 69 is coupled to the base electrodes of the second stage of amplifying transistors 70 and 71. The output of transistors 70 and 71 developed across load resistors 72 and 73 is made available on output terminals 60 and 61. A controlled constant current source 74 operates to provide a constant emitter current for transistors 64 and 65 independent of changes in the supply voltage as previously explained. Similarly, a controlled constant current source 75 operates to provide a constant emitter current for transistors 70 and 71. In place of the control arrangement including diodes 43 and 44 of FIGURE 3, resort is now made to a transistorized control arrangement employing compensating transistor 76. All of transistors 64, 65, 66, 67 and 75 are matched to exhibit the same temperature coefficient. Transistor 76 provides the base current compensation for input transistors 64 and 65, whereas current regulator transistor 77 provides the collector current bias for transistor 76. Transistor 76 will provide proper compensation provided its current flow remains the same as that of input transistors 64 and 65. However, since transistor 76 is in a different circuit, some means must be provided to adjust the current to insure equality. This is achieved as follows. The potential at junctions 79 and 80 is applied to the base electrodes of transistors 70 and 71. The base electrode of current regulator transistor 77 senses any potential changes at junction 81 to control the conduction of current in transistor 77 to follow any changes in current through the input transistors 64 and 65. The second stage of amplifying transistors 70 and 71 therefore serve two purposes—to provide amplification of the difference signal and also to adjust current flow through the compensating transistor 76 in a direction to follow current flow changes in the input transistors 64 and 65. The arrangement of FIGURE 5 permits the collector voltages on the input transistors 64 and 65 to be maintained constant and very nearly equal to the collector voltage on compensating transistor 76. Transistors 66 and 67 provide the collector voltage bias for input transistors 64 and 65. The collector bias currents of transistors 64, 65, 76, 66 and 67 are set to be equal by selecting resistors 68, 69 and 78 to be equal. As previously mentioned, transistors 64, 65 and 76 are matched for current gain and base emitter voltage at the operating current. Resistors 82, 83 and 84 are equal. Transistor 76 therefore establishes the bias voltage at its collector electrode and at the junction between resistors 85 and 86 to provide the required bias current through resistor 84 as determined by the collector current from transistor 77. An equal current is provided to the base electrode of transistors 64 and 65 through resistors 82 and 83. As before, changes in transistor current gain with temperature or resistor values with temperature are compensated to the extent that the temperature characteristics of the related components match each other. Effects of changes in supply voltage or common mode voltage are largely eliminated by the action of transistors 66 and 67 in maintaining the collector voltage on transistors 64 and 65 constant and equal to the collector voltage on transistor 76. Effects of changes in the bias current from source 74 are largely eliminated by the action of regulator transistor 77 in maintaining the collector current of compensating transistor 76 equal to the collector currents of input transistors 64 and 65.

While applicant has shown in the control arrangements FIGURES 2, 3 and 4 the use of diodes 43, 44 and 55 as being the constant resistance devices useful in achieving the desired results, any constant resistance device with proper temperature coefficients such as a thermistor would serve the same purpose.

What I claim as new and desire to secure by Letters Patent of the United States is:

1. A differential amplifier circuit adapted to be energized from a supply of positive, negative and ground reference potentials to develop an output signal which is proportional to the difference in amplitudes of applied first and second signals comprising first and second input transistors, each of said input transistors comprising an input base, an output collector and a third emitter electrode; first and second output transistors, each of said output transistors comprising an input emitter, an output collector and a third electrode base; a first load resistor for coupling the output collector of said first output transistor to said positive potential; a second load for coupling the output electrode of said second output transistor to said positive potential; means for direct current coupling said output electrode of said first input transistor to the input electrode of said first output transistor; means for direct current coupling said output electrode of said second input transistor to the input electrode of said second output transistor; a first current regulator means coupling the third emitter electrodes of each of said input transistors to said negative reference potential comprising a voltage regulator diode having an anode and cathode, a first current regulator transistor having a first collector electrode, a first emitter electrode and a first base electrode, a second current regulator transistor having a second collector electrode, a second emitter electrode, and a second base electrode, first, second and third coupling resistors and a biasing resistor; means to couple the first collector electrode to the third emitter electrodes; means to direct current couple said first coupling resistor between said negative reference potential and the first emitter electrode; means to direct current couple the anode to said negative reference potential; means to direct current couple the first and second base electrodes to the cathode; means to direct current couple said second coupling resistor between said negative reference potential and the second emitter electrode; means to couple the cathode and the first and second base electrodes to said biasing resistor; means to direct current couple said biasing resistor to said positive reference potential; means to couple the second collector electrode to said third coupling resistor; means to direct current couple said third coupling resistor to said positive reference potential; means for applying said first signal between the input electrode of said first input transistor and said ground reference potential; means for applying said second signal between the input electrode of said second input transistor and said ground reference potential; a second current regulator means for maintaining the output collector electrode potentials and the injput base electrode bias currents of said input transistors effectively independent of the common mode voltage and independent of said positive and negative reference potentials, said second current regulator means comprising a constant resistance means coupling said third electrode bases of said output transistors to the third emitter electrodes of said input transistors, said constant resistance means consisting a pair of diodes one having a second anode and a second cathode and the other one having a third anode and a third cathode, means to direct current couple the second cathode to the third anode, means to couple the third cathode to the third emitter electrodes and the first collector electrode, means to couple the second anode to said third electrode bases; means for developing a constant potential across said constant resistance means comprising a control circuit coupling the third electrode bases of said output resistors to said positive reference potential consisting of a third current regulator transistor having an opposite conductivity type than either said input or output transistors including a fourth emitter, a fourth base electrode, a fourth collector electrode, a fourth and fifth coupling resistor, a first resistor; means to direct current couple said first resistor between said positive reference potential and said fourth emitter electrode; means to couple one terminal of said fourth and fifth coupling resistor to the fourth collector electrode, and to the second anode and the third electrode bases; means to couple the other terminal of said fourth and fifth coupling resistors to said input base electrodes of said input transistors; and means to direct current couple said fourth base electrode between said third coupling resistor and the second collector electrode.

2. An arrangement according to claim 1 wherein the voltage-temperature characteristic of said pair of diodes is matched to the input temperature characteristic of said input transistors.

3. A differential amplifier circuit adapted to be energized from a supply of positive, negative and reference potential to develop an output signal which is proportional to the difference in amplitudes of applied first and second signals comprising first and second input transistors, each of said input transistors comprising an input base, an output collector and a third emitter electrode, first and second output transistors, each of said output transistors comprising an input emitter, an output collector and a third base electrode, a first load resistor for coupling the output collector electrode of said first output transistor to said positive potential, a second load resistor for coupling the output collector electrode of said second output transistor to said positive potential, means for direct current coupling said output collector electrode of said first input transistor to the input emitter electrode of said first output transistor, means for direct current coupling said output collector electrode of said second input transistor to the input emitter electrode of said second output transistor, a first current regulator means coupling the third emitter electrodes of each of said input transistors to said negative potential, means for applying said first signal between the input base electrode of said first input transistor and said reference potential, means for applying said second signal between the input base electrode of said second input transistor and said reference potential, means for maintaining the output electrode potentials and the input electrode bias currents of said input transistors effectively independent of the common mode voltage and said supply potentials comprising a compensating transistor having an input base, an output collector and a third emitter electrode, means for direct coupling the output collector electrode of said compensating transistor to the third base electrodes of said output transistors, means for direct coupling the third emitter electrode of said compensating transistor to the third emitter electrodes of said input transistors, a coupling resistor coupled between the input emitter electrodes of said output transistors, separate resistors coupling the input base electrodes of said input and compensating transistors to an intermediate point on said coupilng resistor, a second current regulator means for maintaining the current flow through each of said input transistors and said compensating transistor substantially equal comprising a current regulator transistor coupling said output electrode of said compensating transistor to said positive potential, and means responsive to the output signals developed in said load circuits in response to said applied input signals to regulate the current furnished by said current regulator to said compensating transistor.

4. An arrangement according to claim 3 wherein the input temperature characteristics of said compensating and input transistors are matched.

5. A differential amplifier circuit adapted to be energized from a supply of positive potential, negative potential and ground reference potential to develop an output signal which is proportional to the difference in amplitudes of applied first and second signals comprising first and second input transistors, each of said input transistors comprising an input base, an output collector and a commonly connected emitter electrode, first and second output transistors, each of said output transistors comprising an input emitter, an output collector and a commonly connected base electrode, a first direct current load circuit coupling the output collector electrode of said second output transistor to said positive potential, means for direct current coupling said output collector electrode of said first input transistor to the input emitter electrode of said first output transistor, means for direct current coupling said output collector electrode of said second input transistor to the input emitter electrode of said second output transistor, a first current regulator means coupling the commonly connected electrodes of each of said input transistors to said negative potential, means for applying said first signal between the input electrode of said first input transistor and said ground reference potential, means for applying said second signal between the input electrode of said second input transistor and said ground reference potential, means for maintaining the output electrode potentials and the input electrode bias currents of said input transistors effectively independent of the common mode voltage and said supply potentials comprising a constant resistance means having top and bottom terminals wherein the commonly connected base electrodes of each of said output transistors are coupled to the top terminal and the commonly connected emitter electrodes of said input transistors are coupled to the bottom terminal, a second current regulator means for developing a constant potential across said constant resistance means comprising a current regulator transistor coupling the commonly connected base electrodes of said output transistors to said positive potential, and respective means for direct current coupling the input base electrode of each input transistor to the bottom terminal of said constant resistance means.

6. An arrangement according to claim 5 wherein said means for applying said first and second signals comprises an additional first and second transistor, each of said additional transistors comprising an input base, an output collector and a third emitter electrode, means for direct current coupling respective output collector electrodes of said additional first and second transistors to the output collector electrodes of respective ones of said input transistors, means for direct current coupling respective third emitter electrodes of said additional first and second transistors to the input base electrodes of respective ones of said input transistors, and means for applying respective ones of said input signals to the input base electrodes of respective ones of said additional first and second transistors.

7. An arrangement according to claim 5 further comprising an additional first and second transistor, each of said additional transistors comprising an input base, an output collector and a third electrode, means for direct current coupling respective third emitter electrodes of said additional first and second transistors to the commonly connected emitter electrodes of respective ones of said input transistors, means for direct current coupling respective input base electrodes of said additional first and second transistors to the output collector eletcrodes of respective ones of said input transistors, and means for direct current coupling respective output collector electrodes of said additional first and second transistors to the input emitter electrodes of respective ones of said output transistor.

8. An arrangement according to claim 1 wherein said input transistors are field effect transistors.

9. In a transistorized differential operational amplifier having positive, negative, and ground reference potential terminals adapted to be connected to suitable supply voltage sources, a pair of input transistors having commonly connected emitters and each having an input base and an output collector, a pair of output transistors having a commonly connected base and each having an input emitter and a second output collector, said output transistors driven by said input transistors to provide a differential output which is proportional to the difference of the input signals, and a constant current transistor having a base, a collector and an emitter electrode which is coupled between the commonly connected emitters and the negative terminal, the improvements which comprises a constant resistance diode circuit providing the base bias voltage for the input and output transistors, said diode circuit including a plurality of diodes connected in series between the commonly connected bases and the commonly connected emitters of the output and input transistors respectively, and a voltage regulator diode coupled between the base of the constant current transistor and the negative terminal thereby supplying a constant reference voltage to the base of the constant current transistor.

10. In a transistorized differential operational amplifier having positive, negative, and ground reference potential terminals adapted to be connected to suitable supply voltage sources, a pair of input transistors having commonly connected emitters and each having an input base and an output collector, a pair of output transistors having a commonly connected base and each having an input emitter and a second output collector, said output transistors driven by said input transistors to provide a differential output which is proportional to the difference of the input signals, and a constant current transistor having a base, a collector and an emitter electrode which is coupled between the commonly connected emitters and the negative terminal, the improvements which comprises a constant resistance diode circuit providing the base bias voltage for the input and output transistors, said diode circuit including a plurality of dioes connected in series between the commonly connected bases and the commonly connected emitters of the output and input transistors respectively, a voltage regulator diode, and a control circuit including a first current regulator transistor having a first base, a first emitter, and a first collector, a second current regulator transistor having a conductivity type opposite that of said first current regulator transistor including a second base, a second emitter and a second collector, first, second, third, and fourth coupling resistors, said voltage regulator diode is connected between the negative terminal, and the first base of said first current regulator transistor and the base of the constant current transistor to provide a constant reference voltage for the bases of the constant current transistor and said first current regulator transistor, said first current regulator transistor is coupled by its first emitter to the negaitve terminal, and by its first collector to the first coupling resistor and the second base of said second current regulator transistor, said first coupling resistor is connected to the positive terminal, the second emitter of said second current regulator transistor is coupled to the positive terminal by said fourth coupling resistor, the second collector of said second current regulator transistor is coupled by said second and third coupling resistors to the input bases of the input transistors and also to the commonly connected bases of said output transistors thus said amplifier's output signal is independent of variations in said supply voltage sources and independent of the common mode voltages that may be applied to the base of said input transistors.

References Cited

UNITED STATES PATENTS

| | | | |
|---|---|---|---|
| 2,780,682 | 2/1957 | Klein | 330—69 |
| 3,213,290 | 10/1965 | Klein et al. | 307—223 |
| 3,375,457 | 3/1968 | Hollstein | 330—30 |
| 3,378,780 | 4/1968 | Lin | 330—24 |

NATHAN KAUFMAN, Primary Examiner

U.S. Cl. X.R.

330—69

UNITED STATES PATENT OFFICE
CERTIFICATE OF CORRECTION

Patent No. 3,482,177 December 2, 1969

Tage P. Sylvan

It is certified that error appears in the above identified patent and that said Letters Patent are hereby corrected as shown below:

Column 4, line 45, after "a" insert -- constant --. Column 7, line 40, after "second load" insert -- resistor --. Column 8, line 2, "injput" should read -- input --; line 5, "," should read -- ; --.

Signed and sealed this 1st day of December 1970.

(SEAL)
Attest:

Edward M. Fletcher, Jr.
Attesting Officer

WILLIAM E. SCHUYLER, JR.
Commissioner of Patents